United States Patent [19]
Baba

[11] Patent Number: 5,544,339
[45] Date of Patent: Aug. 6, 1996

[54] ARRAY OF DISK DRIVES WITH REDUNDANT CHANNELS

[75] Inventor: Hiroshi Baba, Kamakura, Japan

[73] Assignee: Mitsubishi Denki Kabushiki Kaisha, Tokyo, Japan

[21] Appl. No.: 992,124

[22] Filed: Dec. 17, 1992

[30] Foreign Application Priority Data

Jan. 7, 1992 [JP] Japan ..................... 4-000885

[51] Int. Cl.$^6$ ............... G06F 11/20; G06F 13/16; G06F 3/06
[52] U.S. Cl. .......... 395/441; 395/182.04; 364/DIG. 1; 364/248.1; 364/266.5; 364/268.7
[58] Field of Search ...................... 395/425, 325, 395/500, 600, 575, 200, 800, 441, 182.04, 476, 477; 371/10.1, 11.1, 10.2; 364/DIG. 1; 365/200

[56] References Cited

U.S. PATENT DOCUMENTS

| | | | |
|---|---|---|---|
| 5,041,971 | 8/1991 | Carvey et al. | 395/800 |
| 5,093,910 | 3/1992 | Tulpule et al. | 395/575 |
| 5,148,432 | 9/1992 | Gordon et al. | 381/10.1 |
| 5,237,658 | 8/1993 | Walker et al. | 395/200 |
| 5,388,243 | 2/1995 | Glider et al. | 395/425 |
| 5,412,661 | 5/1995 | Hao et al. | 395/182.04 |

FOREIGN PATENT DOCUMENTS 91-15823 of 1991 WIPO.
91-14229 of 1991 WIPO.
91-13399 of 1991 WIPO.

OTHER PUBLICATIONS

Schulze, Katz & Patterson "How Reliable is a Raid" 1989 IEEE pp. 118–121 1989.
Oyama, Ogawa & Sugiyama "F6490 Magnetic Disk Sybsystem: DIA" Feb., 1991 pp. 291–295 Fujitsu Scientific & Tech. Journal.

Primary Examiner—Eddie P. Chan
Assistant Examiner—Reginald Bragdon
Attorney, Agent, or Firm—Wolf, Greenfield & Sacks, P.C.

[57] ABSTRACT

An array of disk drives stores information which is accessed through multiple channels by a host computer. Different channels are coupled to different sequences of disk drives. Different disk drives can be accessed simultaneously through different channels, enabling high data transfer rates. The same disk drive can be accessed through two different channels, enabling access even if one off the channels is busy or malfunctioning. According to one aspect of the invention the channels are divided into at least two mutually exclusive sets of channels, each set providing access to all the disk drives.

33 Claims, 8 Drawing Sheets

ARRAY OF DISK DRIVES WITH REDUNDANT CHANNELS

BACKGROUND OF THE INVENTION

This invention relates to an array of disk drives accessed by a host computer, more particularly to the channel arrangement of such an array.

Disk drives are widely used for secondary storage of information in computer systems, and many computer systems have an array of disk drives which are connected to a host computer by one or more channels. One advantage of such an array is that it can provide extra reliability by storing data in a redundant form. In particular, it has been shown that a redundant array of inexpensive disk drives (referred to as a RAID) can provide higher reliability at lower cost than a single large, expensive disk drive.

RAID schemes have been classified into five levels: a first level in which the same data are stored on two disks (referred to as mirrored disks); a second level in which data are bit-interleaved across a group of disks, including check disks on which redundant bits are stored using a Hamming code; a third level in which each group has only a single check disk, on which parity bits are stored; a fourth level that uses sector interleaving and a single check disk per group; and a fifth level that uses sector interleaving and distributes the check information evenly over all disks in a group, so that, the writing of check information is not concentrated on a single disk drive.

These RAID schemes show how data can be efficiently and reliably stored, but they do not consider the reliability of the channels by which the data are accessed. In the simplest interconnection scheme each disk drive is coupled to the host computer by its own channel. Besides requiring an impractically large number of channels for a large array, this scheme has the disadvantage that a failure in any channel disables access to one disk drive.

In another common scheme a sequence of disk drives is coupled to the host computer through a single channel. This scheme reduces the number of channels required, but has the disadvantage that the disks coupled to a given channel can be accessed only one at a time, and the further disadvantage that a channel fault disables access to some or all of the coupled disk drives.

In an elaboration of this scheme the channels are duplicated by providing two channels for access to each sequence of disk drives. This scheme greatly improves access reliability, but access is still limited to two disk drives per sequence at a time, and there is still the risk that faults in both channels may disable access to some or all of the disk drives in the sequence.

SUMMARY OF THE INVENTION

It is accordingly an object of the present invention to provide an array of disk drives that combines high reliability with a reasonable number of channels.

Another purpose of the invention is to enable an array of disk drives to function normally despite one or more channel faults.

Yet another object of the invention is to increase the number of available options for simultaneous access in an array of disk drives.

Still another object of the invention is to reduce access delays caused by channel contention.

An array of disk drives according to the present invention comprises a plurality of disk drives for storing information and a plurality of channels for accessing the information. The channels are arranged so that at least one of the disk drives is coupled to two different channels, and at least one of the channels is coupled to a sequence of two or more disk drives that differs from the sequence of disk drives to which any other channel is connected. A controller receives access commands from a host computer and selects channels for executing the access commands.

According to one aspect of the invention, the channels are divided into two or more mutually exclusive sets. Each disk drive is coupled to just one channel in each set of channels. According to another aspect of the invention, the sets of channels are mutually orthogonal. According to yet another aspect of the invention, each set of channels has its own controller, and different sets of channels are used by different host computers.

DETAILED DESCRIPTION OF THE INVENTION

Embodiments of the present invention will be described with reference to the attached drawings. The drawings illustrate the invention but do not limit its scope, which should be determined solely from the appended claims.

In these descriptions and the appended claims, the word "set" will be used to refer to a collection of one or more objects, and the word "sequence" to refer to a set of objects taken in a specific order. Given three objects A, B, and C, for example, ABC and BCA are the same set but different sequences; AB and ABC are both different sets and different sequences; the single object A constitutes both a set and a sequence; and there are no empty sets or empty sequences.

Figure 1:
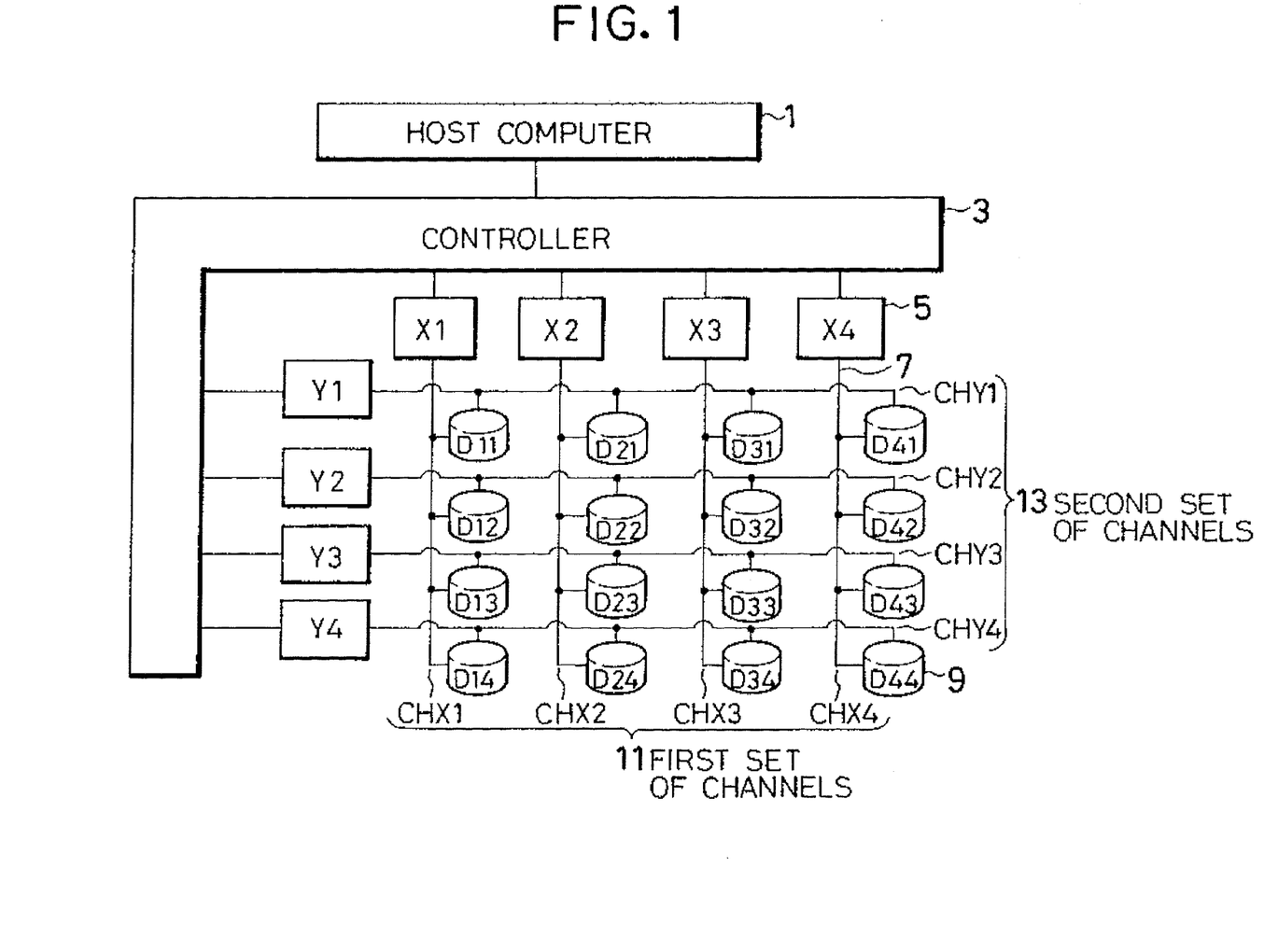
FIG. 1 is a block diagram illustrating a two-dimensional orthogonal array of disk drives.

Referring to FIG. 1, the invented array of disk drives provides secondary, nonvolatile storage of information for a host computer 1. A controller 3 is connected to the host computer 1, and to a plurality of channel controllers 5 denoted X1, X2, X3, X4, Y1, Y2, Y3, and Y4. Each channel controller is part of a corresponding channel 7, which comprises the channel controller and cables coupling the channel controller to a sequence of disk drives 9. The channels are denoted CHX1, CHX2, CHX3, CHX4, CHY1, CHY2, CHY3, and CHY4. The disk drives are denoted D11, D12, . . . , D34, D44.

Channels CHX1, CHX2, CHX3, and CHX4 form a first set of channels 11. Channels CHY1, CHY2, CHY3, and CHY4 form a second set of channels 13. Every disk drive 9 is coupled to just two channels: one channel in the first set of channels 11, and one channel in the second set of channels 13. The first and second sets of channels are orthogonal, meaning that for any pair of channels comprising a first channel in the first set of channels 11 and a second channel in the second set of channels 13, there is just one disk drive coupled to both the first channel and the second channel.

The invention is not limited to an orthogonal array of sixteen disk drives as in FIG. 1. The array may have an unlimited number of disk drives, as long as the number is greater than one. Examples of arrays with different numbers of disk drives, and of non-orthogonal arrays, will be shown later.

Figure 2:
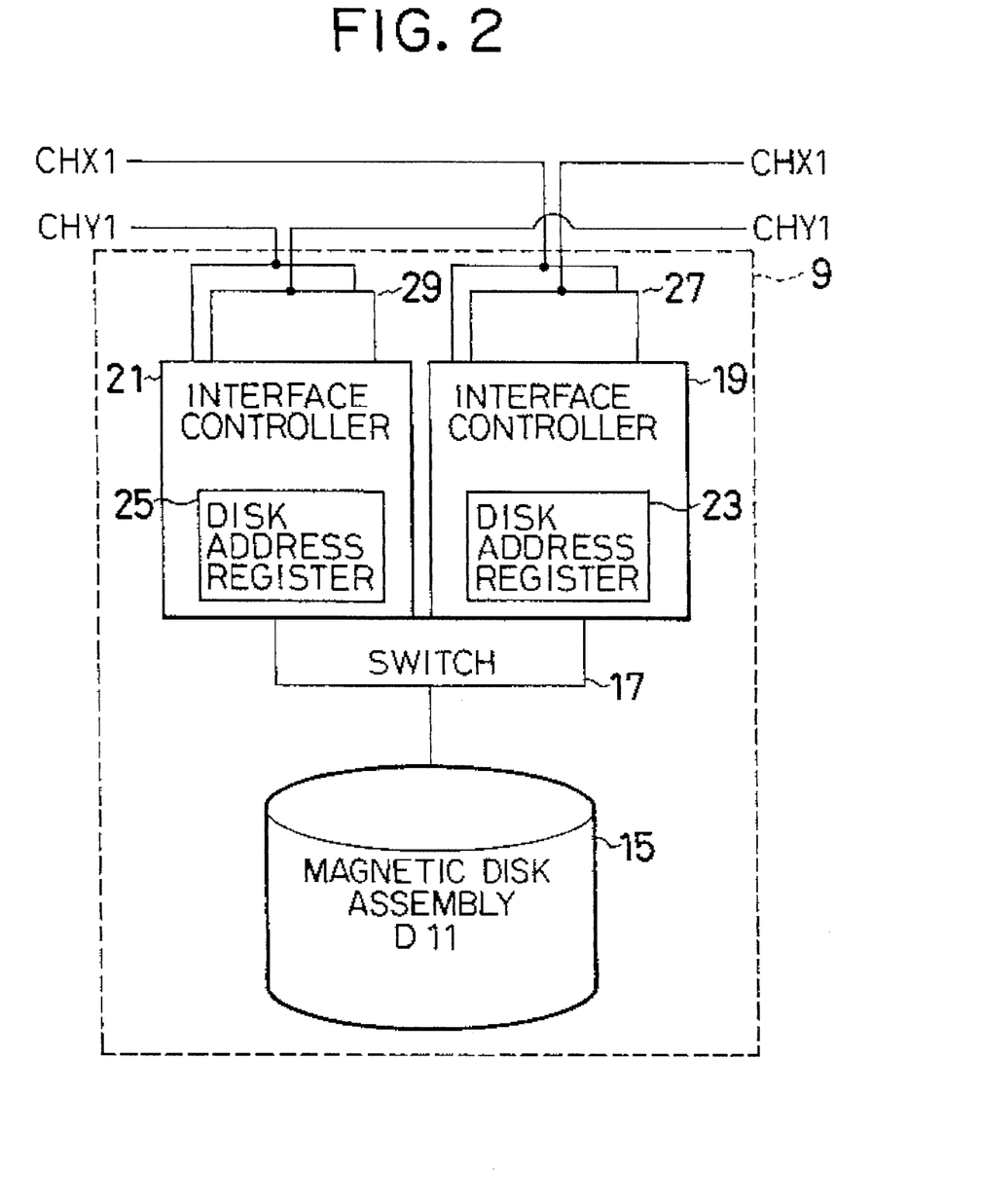
FIG. 2 is a block diagram illustrating the channel interconnections of one disk drive.

FIG. 2 is a more detailed drawing of a disk drive 9 (e.g. D11) showing how it is coupled to a pair of channels (e.g. CHX1 and CHY1). The disk drive 9 comprises a magnetic disk assembly 15 coupled via a switch 17 to a pair of interface controllers 19 and 21, which have respective disk address registers 23 and 25. The magnetic disk assembly comprises one or more rigid magnetic platters, magnetic heads, motors to drive the platters and heads, and various electronic devices that control the motors, encode and decode data, correct soft errors, and carry out other Functions. Details will be omitted since they are familiar to those skilled in the art.

The interface controller 19 is coupled by a pair of connectors 27 to channel CHX1. The interface controller 21 is coupled by a pair of connectors 29 to channel CHY1. Detailed specifications for the interface controllers 19 and 21 and connectors 27 and 29 can be found, for example, in the Small Computer Systems Interface (SCSI) standard.

The disk address registers 23 and 25 contain a disk address by which the interface controllers 19 and 21 determine whether read and write commands received from the channel are intended for this disk drive, in which case the commands are executed, or for another disk drive in the same channel, in which case the commands are ignored. It is not necessary for the two disk address registers 23 and 25 to contain the same address.

The invention is of course not limited to magnetic disk drives equipped with SCSI interfaces; it is equally applicable to magnetic disk drives with other interfaces, or to other types of disk drives, including optical disk drives and magneto-optical disk drives.

Referring again to FIG. 1, the invented disk array normally operates as follows. When the host computer 1 sends the controller 3 a command to read or write data, the controller 3 first determines which disk drive or drives are to be accessed and selects an appropriate channel or channels. To read or write data on disk drive D11, for example, the controller 3 can select channel CHX1. If channel CHX1 is already busy accessing a different disk drive, the channel controller can select channel CHY1. Read or write access is carried out by the channel controller (X1 or Y1) in the selected channel.

If the read or write command requires access to two disk drives, such as D11 and D12, the controller 3 selects two channels such as CHY1 and CHY2 and commands their controllers Y1 and Y2 to perform the two accesses simultaneously. If either channel CHY1 or CHY2 is busy then channel CHX1 can be selected instead. Even if both channels CHY1 and CHY2 are busy the access can still be carried out using channel CHX1, although in this case the two disk drives D11 and D12 cannot be accessed simultaneously.

Similarly, if a read or write command requires access to three or more disk drives, the controller 3 selects appropriate channels and commands their channel controllers to carry out the accesses. A maximum of eight disk drives can be accessed simultaneously.

One advantage of the array in FIG. 1, and of orthogonal arrays in general, is that any two disk drives in the array can be accessed simultaneously, even if one of the channels to one of the disk drives is already busy. For example, disk drives D11 and D21 can be accessed simultaneously using channels CHX1 and CHX2. If channel CHX1 is busy, disk drives D11 and D21 can still be accessed simultaneously through channels CHY1 and CHX2. Access to a particular pair of disk drives is therefore unlikely to be delayed because of channel contention.

An orthogonal array such as the one in FIG. 1 has a further property that reduces access delays due to channel contention: any set of five disk drives in the array can be accessed simultaneously, by using channels in both the first and second sets of channels 11 and 13. For example, disk drive D11 can be accessed through channel CHX1 while drive D21 is accessed through through channel CHY1, drive D31 through channel CHX3, drive D12 through channel CHY2, and drive D22 through channel CHX2.

With the disk array in FIG. 1 it is possible to implement any of the Five RAID levels in a highly reliable manner. RAID levels one, three, and five will be considered below. The situation For RAID levels two and four is similar.

On RAID level one, pairs of mirrored disk drives are preferably disposed so that the two disk drives in each pair are in different rows and different columns and thus have no channels in common. For example, one mirrored pair might comprise disk drives D11 and D12, and another might comprise D21 and D12. Data on the D11–D22 pair can then be accessed through any of the four channels CHX1, CHX2, CHY1, and CHY2. If one of these four channels fails, disk drives D11 and D22 are still both accessible. Even if three of the channels Fall, the data can still be accessed on one of the two mirrored disks, using the fourth channel.

On RAID level three, the array in FIG. 1 can be divided into four groups of four disk drives each. The groups are preferably arranged so that the disk drives in each group are disposed in different rows and columns. For example, one group might comprise the four disk drives D11, D22, D33, and D44, with disk drives D11, D22, and D33 storing data bits and disk drive D44 storing parity bits.

In write access, data are written to all four of these disk drives simultaneously, using either the first set of channels 11 or the second set of channels 13. Using the first set of channels, for example, the controller 3 divides the data into groups of three bits each, sends the first bit to channel CHX1, the second bit to channel CHX2, and the third bit to channel CHX3, calculates a parity bit, and sends the parity bit to channel CHX4. This scheme of distributing individual bits across the four channels is referred to as bit interleaving. If bit interleaving is inconvenient, it is possible to distribute the data across the channels in larger units such as eight, sixteen, thirty-two, or sixty-four bits, a scheme referred to as byte or word interleaving.

In read access, data are read from all four of these disk drives simultaneously, using either the first set of channels 11 or the second set of channels 13. If in data read from disk drive D11 there is an error that cannot be corrected in disk drive D11 itself, this is reported to the controller 3, which then reconstructs the correct data by using the data read from disk drives D22 and D33 and the parity data read from disk drive D44.

On RAID level five, the disk drives are divided into groups in the same way as on RAID level three, but in each group, parity data for different sectors are written on different disk drives. (A sector is the minimum amount of data that can be written to or read from one disk drive per access.) In sector one, for example, disk drive D11 stores parity bits while disk drives D22, D33, and D44 store data bits; in sector two, disk drives D11, D33, and D44 store data bits while disk drive D22 stores parity bits; and so on. Data are stored by sector interleaving; that is, data are divided into sector-size blocks, which are written on different disk drives.

To modify the data on sector one of disk drive D33, for example, the controller 3 commands channels CHX1 and CHX3 (or CHY1 and CHY3) to read the existing parity information and data from sector one of disk drives D11 and D33; then it calculates new parity information from the formula:

new parity=old data XOR old parity XOR new data where XOR denotes the logical exclusive OR operation. Next the controller 3 commands channel CHX3 to write the new data to sector one on disk drive D33, and channel CHX1 to write the new parity information to sector one on disk D11.

To read the data from sector one of disk drive D33, the controller 3 issues a read command to channel CHX3. Execution of this command completes the operation, provided no read error occurs. If a read error does occur, the controller 3 can retry the command using channel CHY3. If a read error still occurs, the controller 8 commands channels CHX1, CHX2, and CHX4 (or CHY1, CHY2, and CHY4) to read sector one on disks drives D11, D22, and D44, and reconstructs the desired data From the data and parity information thus obtained.

An advantage of RAID level five is that it is possible to modify data in, for example, sector one of disk drive D33 and sector two of disk drive D44 simultaneously: channels CHX3 and CHX1 are used to access data on disk drive D33 and associated parity information on disk drive D11, while channels CHX4 and CHX2 are used to access data on disk drive D44 and associated parity information on disk drive D22. The novel array in FIG. 1 enhances this advantage by providing further channel options: if channels CHX1 and CHX2 are already busy accessing disk drives D12 and D23, for example, the accesses to disk drives D11 and D22 can be carried out via channels CHY1 and CHY2 instead.

Another advantage of the array in FIG. 1 is that read errors caused by disk-drive faults can easily be distinguished from read errors caused by channel faults. When a read error occurs, it suffices to access the same disk drive via a different channel. If the error persists, the fault is in the disk drive; if the error does not persist, the fault is in the channel.

Two examples of the occurrence of multiple channel faults will be shown next. For simplicity, the drawings will show only six channels, but the conclusions apply to arrays of any size.

Figure 3:
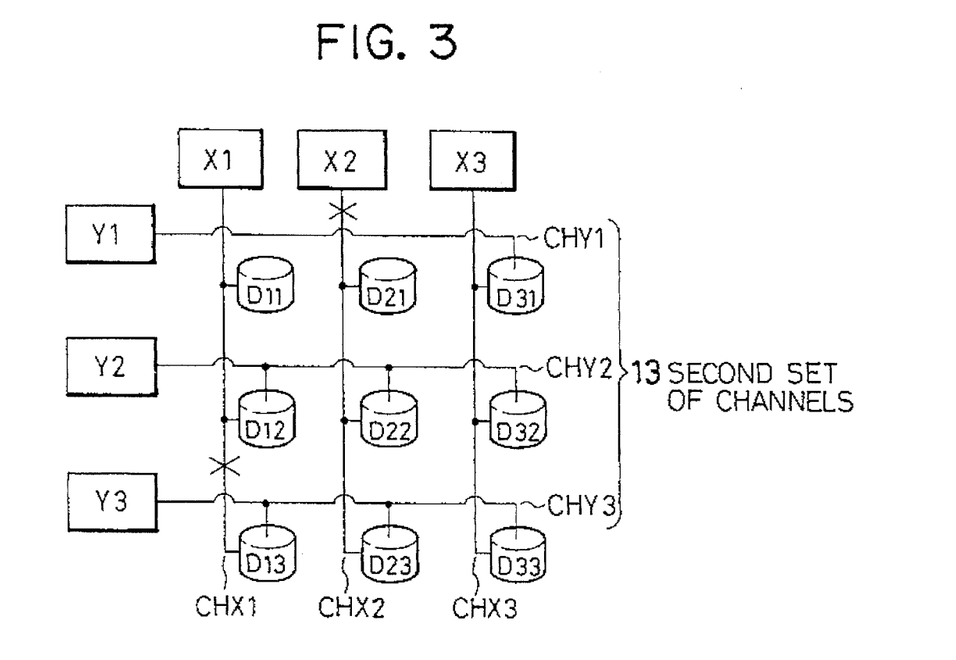
FIG. 3 illustrates the effect of faults in two channels in the same set of channels.

FIG. 8 shows a case in which CHX1 has failed at a point between disk drives D12 and D13, and channel CHX2 has failed at a point between channel controller X2 and disk drive D21. Despite these faults, all disk drives are still accessible through the second set of channels 13, and they remain accessible while channels CHX1 and CHX2 are being repaired. In general, any number of channel faults in one set of channels still leaves the entire array accessible From the other set of channels.

Figure 4:
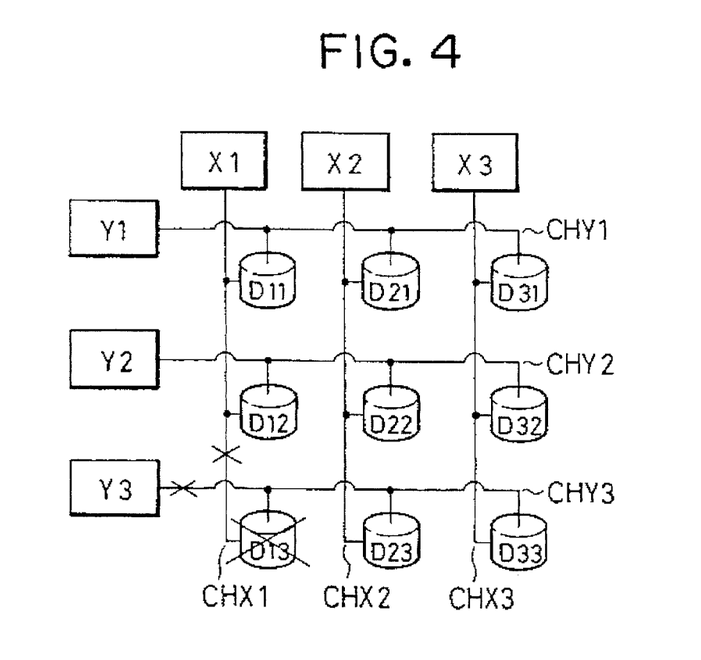
FIG. 4 illustrates the effect of faults in two channels in different sets of channels.

FIG. 4 shows a case in which channel CHX1 has failed at a point between disk drives D12 and D13 and channel CHY3 has failed at a point between channel controller Y2 and disk drive D13. In this case disk drive D13 becomes inaccessible. The data on disk drive D13 can still be recovered, however, if any of the RAID schemes of redundant storage is used. The other disk drives are all accessible through other channels, and they remain accessible while channels CHX1 and CHY3 arc being repaired.

To summarize, the array scheme in FIG. 1 assures that even the simultaneous failure of two channels will disable access to at most one disk drive. If data have been stored redundantly in the array, as in any of the RAID schemes, then the data on the inaccessible disk drive can be recovered from redundant data on other disk drives, accessed using other channels.

Figure 5:
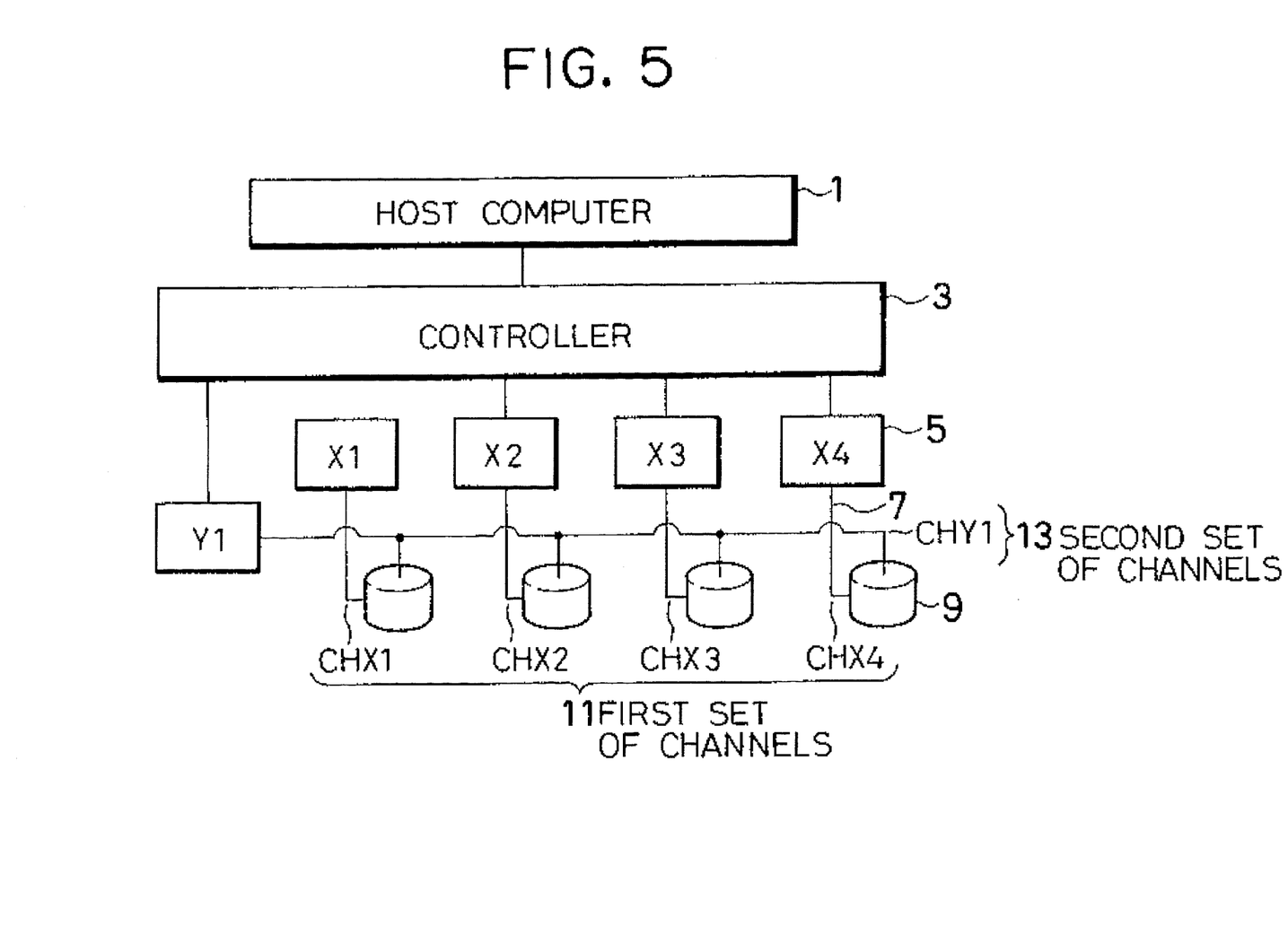
FIG. 5 is a block diagram illustrating another two-dimensional orthogonal array of disk drives.

It is not necessary for the numbers of channels in the two set of channels 11 and 13 to be equal. FIG. 5 shows the extreme case in which the second set of channels comprises a single channel CHY1. In this case all four disk drives in the array can be accessed at once using the four channels CHX1, CHX2, CHX3, and CHX4, but only one disk drive can be accessed at a time via the second set of channels 13. The data transfer rate using the first set of channels 11 is up to four times as fast as the data transfer rate using the second set of channels 13. The first set of channels 11 can therefore be used for high-speed access, and the second set of channels 13 can be used when speed is not important.

Figure 6:
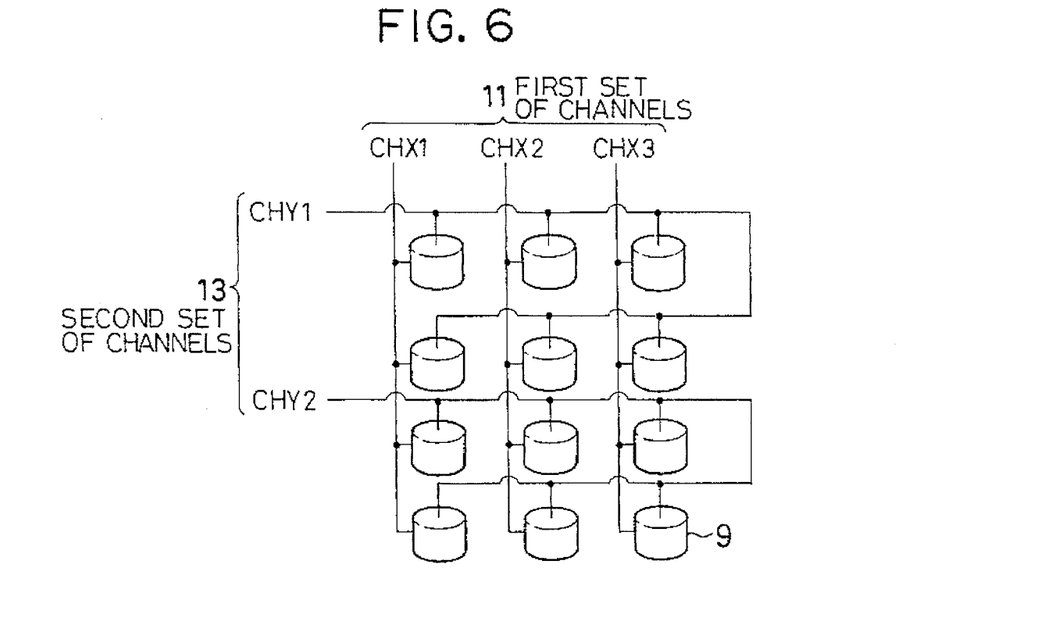
FIG. 6 illustrates a non-orthogonal two-dimensional array of disk drives.

Neither is it necessary for the first and second sets of channels to be mutually orthogonal. FIG. 6 shows an array of twelve disk drives 9 in which the first set of channels 11 comprises three channels CHX1, CHX2, and CHX3, each coupled to a sequence of four disk drives, and the second set of channels 13 comprises two channels CHY1 and CHY2, each coupled to a sequence of six disk drives. As before, each disk drive 9 can be accessed through two channels, but now each channel in the first set of channels 11 has two disk drives in common with each channel in the second set of channels 13. The first set of channels 11 can be used for high-speed access and the second set of channels 13 for lower-speed access, as in FIG. 5.

Figure 7:
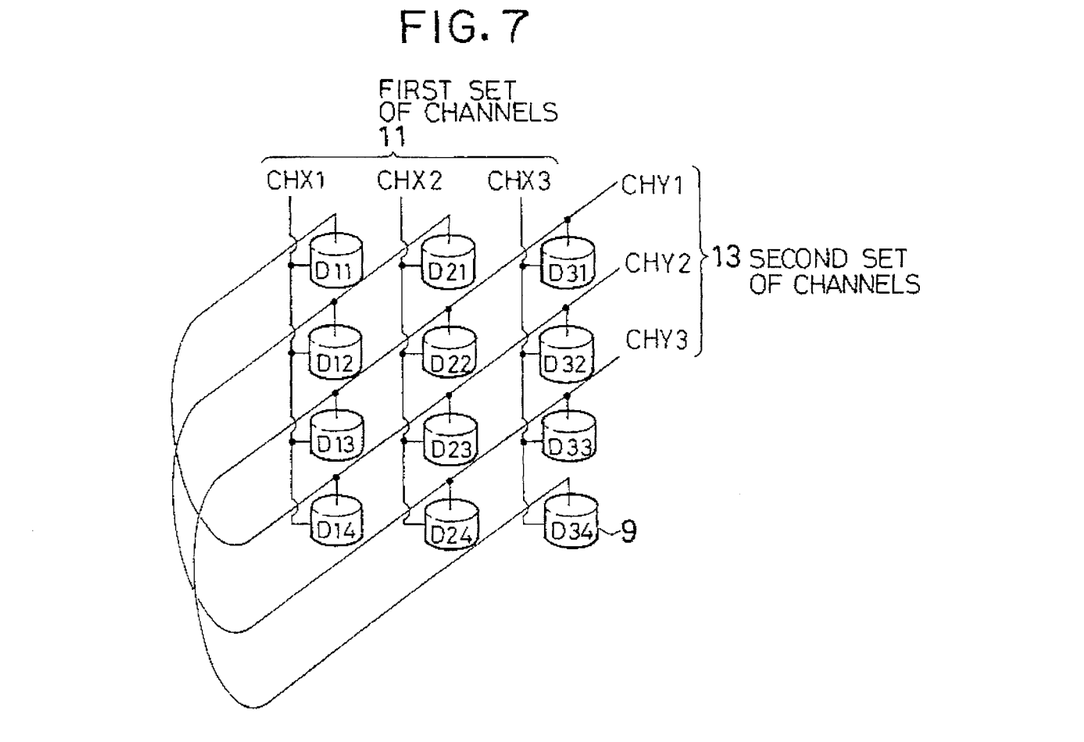
FIG. 7 illustrates another non-orthogonal two-dimensional array of disk drives.

FIG. 7 shows another non-orthogonal array of twelve disk drives. The first set of channels 11 comprises three channels CHX1, CHX2, and CHX3, each coupled to four disk drives. The second set of channels 13 comprises three channels CHY1, CHY2, and CHY3, each also coupled to four disk drives. Channel CHY1 has one disk drive (D13) in common with channel CHX1, one disk drive (D22) in common with channel CHX2, and two disk drives (D31 and D34) in common with channel CHX3. Arrangements of the types shown in FIGS. 6 and 7 can be used to increase the number of disk drives in an array without increasing the number of channels.

Figure 8:
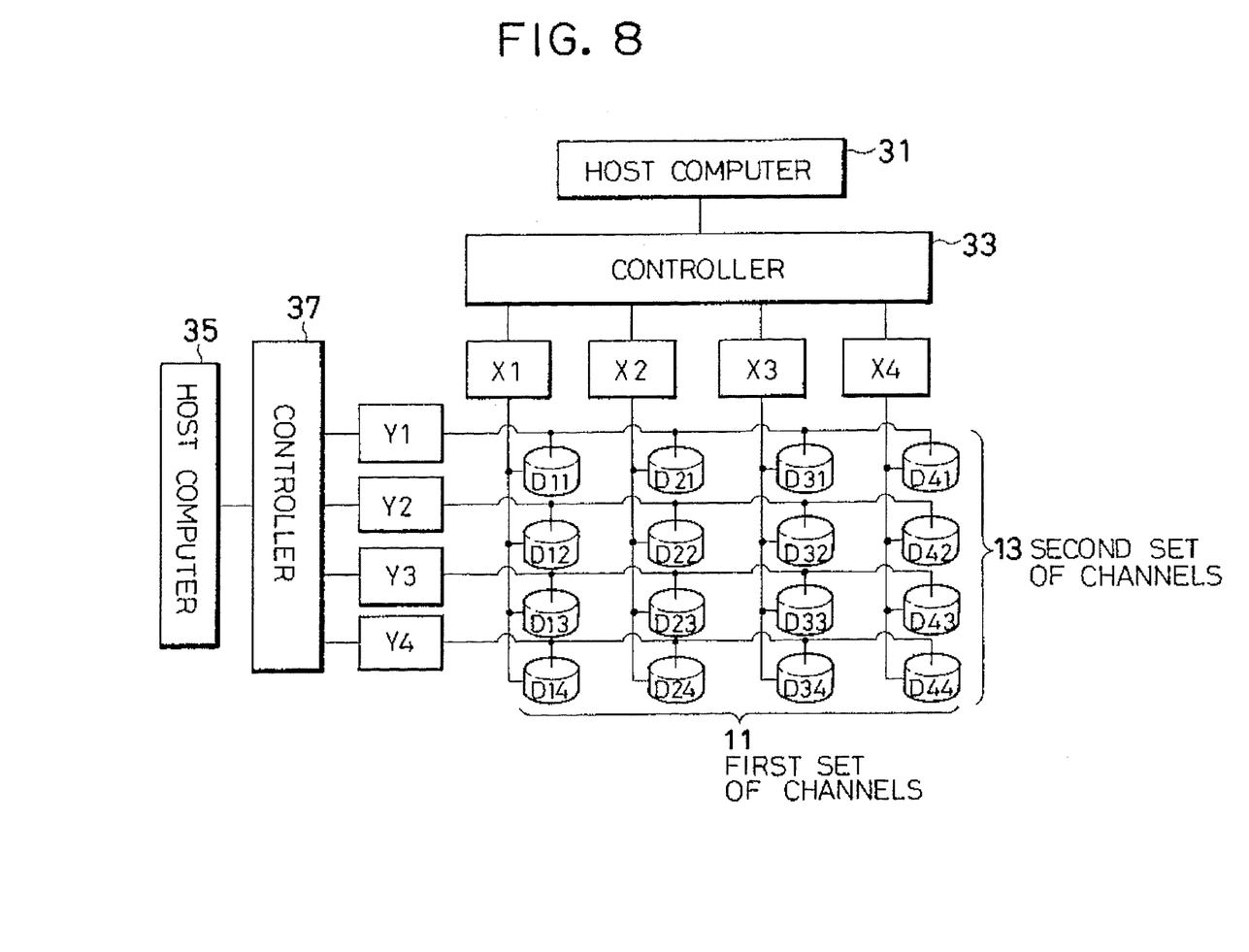
FIG. 8 is a block diagram illustrating a two-dimensional orthogonal array of disk drives accessed by two host computers.

The invented array of disk drives can be utilized in a different way by coupling the first set of channels 11 and the second set of channels 13 to two different host computers. Referring to FIG. 8, a first host computer 31 is inked to a controller 33 which is connected to the channel controllers X1, X2, X3, and X4 of the first set of channels 11. A second host computer 35 is linked to a controller 37 which is connected to the channel controllers Y1, Y2, Y3, and Y4 of the second set of channels 13. Both host computers 31 and 35 thus have access to the same data.

Since the first and second sets of channels 11 and 13 are controlled by different controllers 33 and 37, both controllers 33 and 37 may attempt to access the same disk drive at the same time by different channels. In this case the switch 17 in FIG. 2 selects one of the channels, e.g. channel CHX1. While controller 33 is accessing the disk drive via channel CHX1 and interface controller 19, the other interface controller 21 returns a busy signal via the other channel CHY1 to the other controller 37, which then waits its turn for access. When the access through channel CHX1 and the interface controller 19 is completed, the switch 17 selects interface controller 21, which then turns off the busy signal, and access via channel CHY1 can begin. In this way the switch arbitrates between access requests from different channels.

The two host computers do not have to possess the same numbers of channels, and the channels do not have to be arranged orthogonally. Arrays such as those in FIGS. 6 and 7 can also be used with two host computers.

Figure 9:
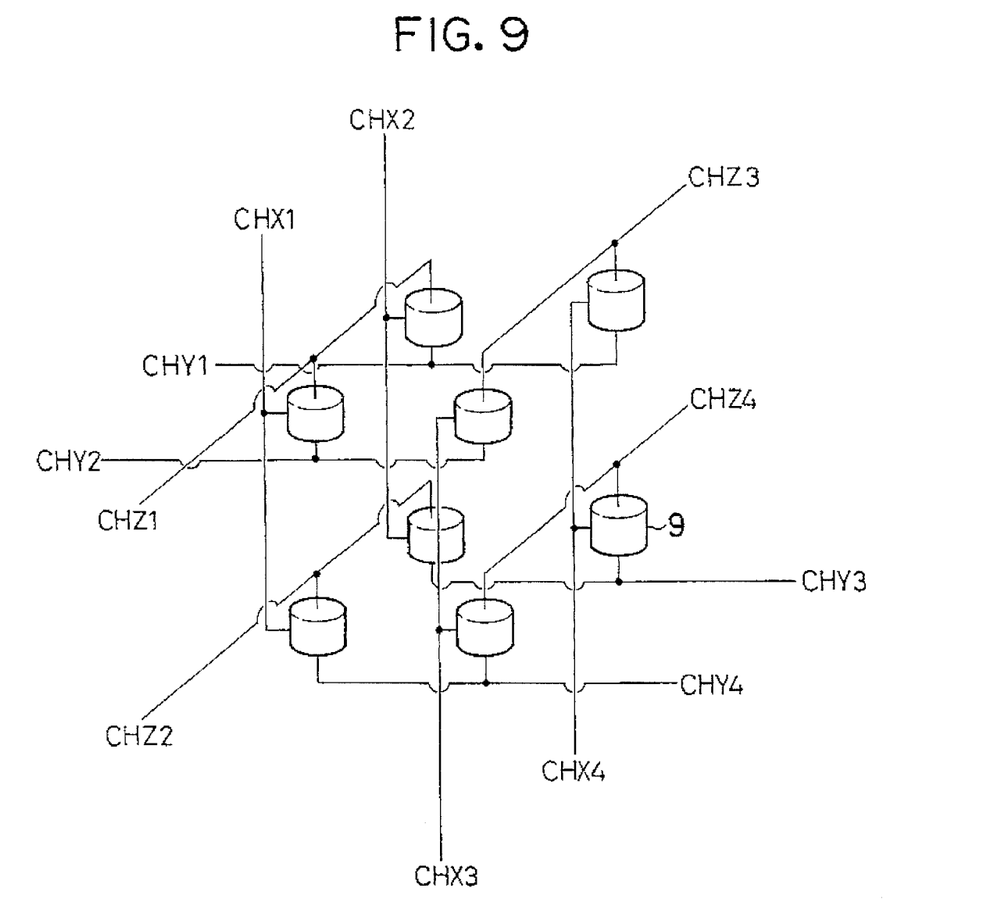
FIG. 9 illustrates a three-dimensional array of disk drives.

The arrays shown so far have been two-dimensional, but the inventive concept can easily be extended to higher dimensions. FIG. 9 shows a three-dimensional array of eight disk drives 9 accessed through three sets of channels. The first set comprises channels CHX1, CHX2, CHX3, and CHX4. The second set comprises channels CHY1, CHY2, CHY3, and CHY4. The third set comprises channels CHZ1, CHZ2, CHZ3, and CHZ4. Each channel is coupled to two disk drives 9.

Each disk drive is accessible through three channels, one from each set of channels. The scheme for coupling the disk drives to the channels is similar to that shown in FIG. 2, except that there are three pairs of connectors and three interface controllers, and the switch selects one of the three interface controllers.

The array in FIG. 9 provides extremely high reliability because even failures in two channels in different sets of channels will not disable access to any disk drive. This array is also suitable for providing access to the array of disk drives from three host computers.

If even greater reliability is required, or if it is necessary to provide access from a larger number of host computers, the number of dimensions in the array can be increased still further. In the general case there are N sets of channels and each disk drive is connected to N channels, one in each set.

Figure 10:
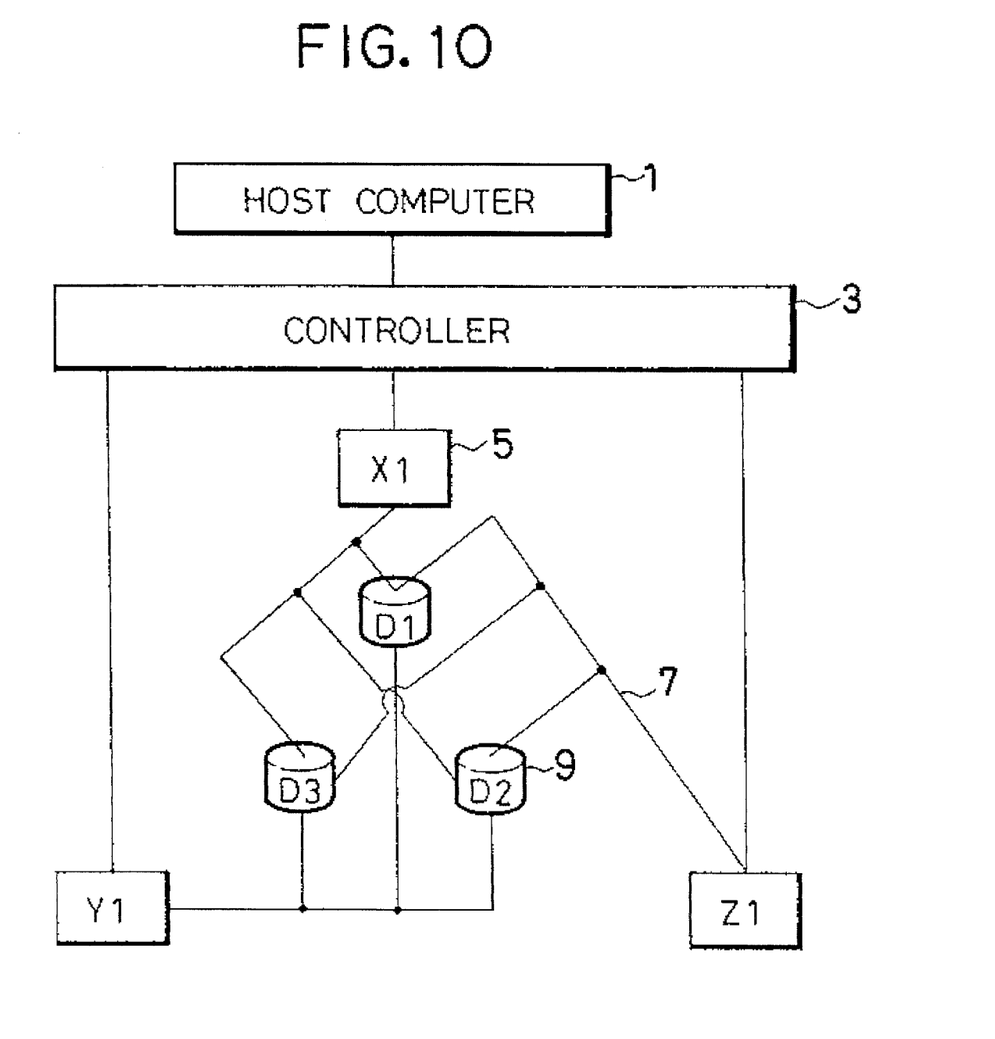
FIG. 10 illustrates an array of disk drives in which different channels are coupled to the same disk drives in different sequences.

FIG. 10 shows a smaller array comprising three disk drives 9, each coupled to three channels. The first set of channels comprises a single channel CHX1; the second set of channels comprises a single channel CHY1; the third set of channels comprises a single channel CHZ1. All three channel controllers X1, Y1, and Z1 are coupled to the same three disk drives, but in different sequences: channel controller X1 is coupled first to disk drive D1, then to disk drive D2, then to disk drive D3; channel controller Y1 is coupled to D3, then D1, then D2; channel controller Z1 is coupled to D2, then D3, then D1.

Coupling each disk drive to three channels provides intrinsically high reliability, but coupling the disk drives to different channels in different sequences raises the reliability even further. If every channel fails at an intermediate point (beyond the first disk drive as seen from the channel controller), all disk drives will still be accessible: D1 from channel controller X1, D2 from channel controller Z1, and D3 from channel controller Y1.

FIG. 10 shows all three channels linked to a single host computer 1, but the same arrangement of channels and channel controllers can of course be used to provide access from three host computers. In general, up to N! (N factorial) host computers can be coupled to a single set of N disk drives using just one channel for each host computer, the channels being arranged so that each host computer sees the disk drives in a different sequence order.

The invention is highly compatible with RAID schemes, but the invention is of course not restricted to the five RAID levels described above. It can also be applied to increase the reliability of non-redundant arrays of disk drives.

The arrays in the drawings have all been symmetrical: all disk drives have been coupled to the same number of channels, and within each set of channels, all channels have been coupled to the same number of disk drives. The invention is not, however, restricted to symmetrical arrays: different disk drives may be coupled to different numbers of channels, and even within the same set of channels, different channels may be coupled to different numbers of disk drives. It would be difficult to give an exhaustive list of all array topologies falling within the spirit and scope of the invention; those skilled in the art will find innumerable modifications that can be made to adapt the arrays shown in the drawings to the requirements of specific computer installations.

What is claimed is:

1. An apparatus for storing information accessed by a host computer, comprising:

a plurality of disk drives for storing information;

a plurality of channels, each channel coupled to a channel controller, each channel coupled to a sequence of disk drives of said plurality of disk drives, for accessing information from said plurality of disk drives, arranged so that a first channel is coupled to a first sequence of disk drives, and a second channel is coupled to a second sequence of disk drives wherein the first sequence and second sequence are different and have at least one disk drive in common; and a controller coupled to said plurality of channels, for receiving access commands from said host computer and selecting channels, from among said plurality of channels, to execute said access commands.

2. The apparatus of claim 1, wherein said plurality of channels includes a third channel coupled to a third sequence of disk drives, each of the first, second and third sequences being different and including an identical set of disk drives of said plurality of disk drives.

3. The apparatus of claim 1, wherein said plurality of channels includes a plurality of mutually exclusive sets of channels, and each disk drive in said plurality of disk drives is coupled to at least one channel in each of the plurality of mutually exclusive sets of channels.

4. The apparatus of claim 3, wherein each disk drive in said plurality of disk drives is coupled to exactly one channel in each of the plurality of mutually exclusive sets of channels.

5. The apparatus of claim 4, wherein no two channels in said plurality of channels are coupled to an identical set of disk drives.

6. The apparatus of claim 3, wherein the plurality of mutually exclusive sets of channels includes a first set having a first number of channels and a second set having a second number of channels, wherein the first number equals the second number.

7. The apparatus of claim 3, wherein the plurality of mutually exclusive sets of channels includes a first set having a first number of channels and a second set having a second number of channels, wherein the first number is greater than the second number, the first set being used for high speed data access and the second set being used for lower speed data access.

8. The apparatus of claim 3, wherein each of the mutually exclusive sets of channels is controlled by a separate host computer.

9. The apparatus of claim 1, wherein at least one disk drive among said plurality of said disk drives includes:
   a disk assembly for storing data;
   a first pair of connectors coupled to one channel of said plurality of channels;
   a second pair of connectors coupled to another channel of said plurality of channels;
   a first interface controller coupled to said first pair of connectors, having a disk address register for identifying said at least one disk drive;
   a second interface controller coupled to said second pair of connectors, having a disk address register for identifying said at least one disk drive; and
   a switch for selecting one of said first interface controller and said second interface controller and coupling the selected one of the first interface controller and the second interface controller to said disk assembly.

10. The apparatus of claim 1, wherein:
    the plurality of disk drives includes N different disk drives; and
    the controller includes N different control sections, each control section providing a channel coupled to the N disk drives in a sequence that is different from a sequence provided by any other of the N control sections.

11. An apparatus for storing information accessed by a first host computer, comprising:
    a plurality of disk drives for storing information;
    a first set of channels, each channel of said first set coupled to a channel controller, that provide access to a first set of disk drive groups of said plurality of disk drives, arranged so that each disk drive in said plurality of disk drives belongs to at least one disk drive group of said first set of disk drive groups;
    a second set of channels, each channel of said second set coupled to a channel controller, that provide access to a second set of disk drive groups of said plurality of disk drives, arranged so that each disk drive in said plurality of disk drives belongs to at least one disk drive group of said second set of disk drive groups, wherein the disk drives of each disk drive group are arranged in a sequence and none of the disk drive group sequences of said second set is identical to a disk drive group sequence of said first set; and
    a controller for receiving access commands from said host computer and selecting channels, from among said first set of channels and said second set of channels, to execute said access commands.

12. The apparatus of claim 11, wherein each channel in said first set of channels is coupled to a disk drive group of the first set of disk drive groups, and each channel in said second set of channels is coupled to a disk drive group of the second set of disk drive groups.

13. The apparatus of claim 12, wherein each of said first set of disk drive groups and each of said second set of disk drive groups includes an equal number of disk drives.

14. The apparatus of claim 12, wherein each of said first set of disk drive groups includes a first number of disk drives and each of said second set of disk drive groups includes a second number of disk drives, the first number and second number being different.

15. The apparatus of claim 12, wherein each disk drive group in said second set of disk drive groups has only one disk drive and said first set of disk drive groups has more than one disk drive.

16. The apparatus of claim 11, wherein both said first set of channels and said second set of channels are coupled to the first host computer.

17. The apparatus of claim 11, wherein said first set of channels and said second set of channels are coupled to the first host computer and a second host computer, respectively.

18. The apparatus of claim 17, wherein said controller includes a first controller circuit coupled to the first host computer and said first set of channels, and a second controller circuit coupled to the second host computer and said second set of channels.

19. The apparatus of claim 11, wherein for any pair of channels comprising a first channel in said first set of channels and a second channel in said second set of channels, there is just one disk drive coupled to both said first channel and said second channel.

20. A method for recovering from a channel fault in a disk drive array, comprising the steps of:
    selecting a first sequence of disk drives through a first channel of the disk array;
    detecting a read error for a disk drive of the first sequence;
    selecting a second sequence of disk drives through a second channel of the disk array, the second sequence being different from the first sequence;
    accessing the disk drive through the second channel;
    determining whether the read error for the disk drive persists when accessed through the second channel; and
    continuing to access the disk drive through the second channel responsive to a determination that the read error does not persist in the step of determining whether the read error for the disk drive persists when accessed through the second channel.

21. The method of claim 20, wherein the disk drive is accessible through N channels, N being greater than 2, and further including:
    accessing the disk drive through a I-th channel, I being inclusively between 3 and N, responsive to a determination that the read error persists in the step of determining whether the read error for the disk drive persists when accessed through the second channel;
    determining whether the read error for the disk drive persists when accessed through the I-th channel; and
    continuing to access the disk drive through the I-th channel responsive to a determination, in the step of determining whether the read error for the disk drive persists when accessed through the I-th channel, that the read error does not persist.

22. A method for accessing a disk drive in a disk array, comprising:
    selecting a first sequence of disk drives having the disk drive through a first channel of the disk array:
    accessing, by a first controller, the disk drive through the first channel;
    selecting a second sequence of disk drives having the disk drive through a second channel of the disk array, the second sequence being different from the first sequence;
    initiating, by a second controller, an access of the disk drive through the second channel;

generating, operative in response to the disk drive still being accessed by the first controller in the step of accessing, a busy signal; and completing an access, by the second controller, of the disk drive, responsive to no busy signal being generated in the step of generating.

23. The method of claim 22, further comprising the step of waiting for a busy signal generated, in the step of generating, to de-assert before performing the step of completing the access.

24. An apparatus comprising:

N disk drives;

a plurality of channels for accessing the N disk drives; and a plurality of channel controllers for controlling a flow of data between the plurality of channels and the N disk drives, wherein a first sequence of disk drives is coupled to a first channel of the plurality of channels, and a second sequence of disk drives is coupled to a second channel of the plurality of channels, the first sequence being different from the second sequence, and the first sequence and the second sequence having at least one disk drive in common.

25. The apparatus of claim 24, wherein each of the N disk drives is coupled to at least two of the plurality of channels.

26. The apparatus of claim 24, wherein the plurality of channels comprises a plurality of groups of channels, and each group of channels is coupled to each of the N disk drives.

27. The apparatus of claim 26, wherein each of the plurality of groups of channels includes an equal number of channels.

28. The apparatus of claim 26, wherein each of the plurality of groups of channels is mutually exclusive.

29. The apparatus of claim 26, wherein each of the plurality of groups of channels is coupled to a unique sequence of disk drives.

30. The apparatus of claim 29, wherein each group of channels is controlled by one of the plurality of channel controllers.

31. An apparatus for storing information, comprising:

a plurality of disk drives for storing information;

a first plurality of channels, each channel coupled to a channel controller, each channel coupled to a sequence of disk drives of the plurality of disk drives to provide access thereto; and a second plurality of channels, each channel coupled to a channel controller, each channel coupled to a sequence of disk drives of the plurality of disk drives to provide access thereto, wherein at least one sequence of disk drives coupled to the first plurality of channels is different from at least one sequence of disk drives coupled to the second plurality of channels, and the at least one sequence of disk drives coupled to the first plurality of channels has at least one disk drive in common to the at least one sequence of disk drives coupled to the second plurality of channels.

32. The apparatus of claim 31, further comprising:

at least one host computer for issuing commands for accessing said plurality of disk drives.

33. The apparatus of claim 32, further comprising:

at least one controller, coupled to the at least one host computer and to the first and second pluralities of channels, for executing said commands for accessing said plurality of disk drives.

* * * * *